(12) United States Patent
Lee

(10) Patent No.: US 12,232,398 B2
(45) Date of Patent: Feb. 18, 2025

(54) DISPLAY DEVICE INCLUDING ENCAPSULATION LAYER ON LIGHT EMITTING LAYER

(71) Applicant: Samsung Display Co., Ltd., Yongin-si (KR)

(72) Inventor: Kyunghee Lee, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 223 days.

(21) Appl. No.: 17/494,774

(22) Filed: Oct. 5, 2021

(65) Prior Publication Data

US 2022/0181405 A1 Jun. 9, 2022

(30) Foreign Application Priority Data

Dec. 3, 2020 (KR) .................... 10-2020-0167804

(51) Int. Cl.
*H10K 59/50* (2023.01)
*G02F 1/01* (2006.01)
(Continued)

(52) U.S. Cl.
CPC ........... *H10K 59/50* (2023.02); *G02F 1/0126* (2013.01); *H10K 50/844* (2023.02); *H10K 77/111* (2023.02); *G02F 1/0105* (2013.01); *G02F 1/133331* (2021.01); *G09G 2330/00* (2013.01); *G09G 2340/00* (2013.01);
(Continued)

(58) Field of Classification Search
CPC ............. H10K 50/844; H10K 50/8445; H10K 50/8426; H10K 50/865; H10K 50/15; H10K 50/16; H10K 50/17; H10K 50/171; H10K 50/115; H10K 59/50; H10K 59/35; H10K 59/40; H10K 59/38; H10K 59/122; H10K 59/1216; H10K 59/131; H10K 77/111; H10K 2102/311; G02F 1/0126; G02F 1/0105; G02F 1/133331; G02N 5/23;
(Continued)

(56) References Cited

U.S. PATENT DOCUMENTS 5,434,699 A * 7/1995 Berkovic .............. G02F 1/3617
359/328
11,217,639 B2 1/2022 Baek et al.
(Continued)

FOREIGN PATENT DOCUMENTS

JP H0572668 A * 3/1993 ............. G11B 7/244
JP 2018151432 9/2018
(Continued)

OTHER PUBLICATIONS

Kim, Do Yoon, et al., Stretchable and Reflective Displays: Materials, Technologies and Strategies., Nano Convergence vol. 6, No. 1, 2019.

*Primary Examiner* — Ida M Soward
(74) *Attorney, Agent, or Firm* — KILE PARK REED & HOUTTEMAN PLLC

(57) ABSTRACT

A display device includes a base layer, a light emitting element layer disposed on the base layer, and an encapsulation layer disposed on the light emitting element layer, wherein the encapsulation layer includes an organic film containing a photochromic material that changes color upon stress, and accordingly, the display device may keep satisfactory colors even when highly stretched.

20 Claims, 12 Drawing Sheets

(51) Int. Cl.
| | |
|---|---|
| *H10K 50/84* | (2023.01) |
| *H10K 50/844* | (2023.01) |
| *H10K 77/10* | (2023.01) |
| *G02F 1/1333* | (2006.01) |
| *H10K 50/115* | (2023.01) |
| *H10K 50/15* | (2023.01) |
| *H10K 50/16* | (2023.01) |
| *H10K 50/17* | (2023.01) |
| *H10K 59/121* | (2023.01) |
| *H10K 59/122* | (2023.01) |
| *H10K 59/131* | (2023.01) |
| *H10K 59/38* | (2023.01) |
| *H10K 59/40* | (2023.01) |
| *H10K 59/80* | (2023.01) |
| *H10K 102/00* | (2023.01) |

(52) U.S. Cl.
CPC ............ *H10K 50/115* (2023.02); *H10K 50/15* (2023.02); *H10K 50/16* (2023.02); *H10K 50/17* (2023.02); *H10K 50/171* (2023.02); *H10K 59/1216* (2023.02); *H10K 59/122* (2023.02); *H10K 59/131* (2023.02); *H10K 59/38* (2023.02); *H10K 59/40* (2023.02); *H10K 59/873* (2023.02); *H10K 2102/311* (2023.02)

(58) Field of Classification Search
CPC ............ G09G 2330/02; G09G 2340/00; C09B 57/00; C09B 67/00
See application file for complete search history.

(56) References Cited

U.S. PATENT DOCUMENTS

| | | | | |
|---|---|---|---|---|
| 11,594,578 | B2* | 2/2023 | Lee | ...................... H10K 59/352 |
| 2007/0047058 | A1* | 3/2007 | Lim | ...................... G02B 30/31 |
| | | | | 348/E13.044 |
| 2008/0068964 | A1* | 3/2008 | Somei | .................. G11B 7/0037 |
| | | | | 369/94 |
| 2010/0112270 | A1* | 5/2010 | Bulliard | ................... C09J 7/387 |
| | | | | 427/407.1 |
| 2011/0096504 | A1* | 4/2011 | Hild | .................... H10K 59/8794 |
| | | | | 313/504 |
| 2011/0291552 | A1* | 12/2011 | Kwon | .................... H10K 59/50 |
| | | | | 313/504 |
| 2014/0070186 | A1* | 3/2014 | Kim | ........................ H10K 50/86 |
| | | | | 257/40 |
| 2014/0106111 | A1* | 4/2014 | Nam | ..................... G03F 7/0755 |
| | | | | 522/64 |
| 2016/0293571 | A1* | 10/2016 | Yoon | .................... H10K 77/111 |
| 2016/0351465 | A1* | 12/2016 | Chuang | ............. G06V 40/1306 |
| 2017/0194592 | A1 | 7/2017 | Jiang et al. | |
| 2018/0052493 | A1* | 2/2018 | Hong | .................. H10K 50/8426 |
| 2018/0097045 | A1* | 4/2018 | Maeda | .................... H10K 71/00 |
| 2018/0114825 | A1* | 4/2018 | Hong | ..................... H10K 77/10 |
| 2018/0337354 | A1* | 11/2018 | Sonoda | ................... H10K 59/40 |
| 2019/0207155 | A1 | 7/2019 | Lee et al. | |
| 2019/0287920 | A1* | 9/2019 | Lee | ..................... H01L 23/4334 |
| 2020/0312248 | A1* | 10/2020 | Shin | ..................... G09G 3/3291 |
| 2020/0388666 | A1* | 12/2020 | Park | ..................... H10K 77/111 |
| 2021/0408397 | A1 | 12/2021 | Kim et al. | |
| 2022/0328566 | A1* | 10/2022 | Jo | ........................ H10K 50/865 |
| 2022/0351677 | A1* | 11/2022 | Lee | ...................... G09G 3/3208 |

FOREIGN PATENT DOCUMENTS

| | | | | |
|---|---|---|---|---|
| KR | 10-2014-0033724 | | 3/2014 | |
| KR | 10-1579340 | | 12/2015 | |
| KR | 20180013377 A | * | 2/2018 | ........... H10K 59/122 |
| KR | 20190082362 | | 7/2019 | |
| KR | 102042632 | | 11/2019 | |
| KR | 20200008081 A | * | 1/2020 | ........... H10K 59/131 |
| KR | 10-2020-0036137 | | 4/2020 | |
| KR | 10-2020-0074352 | | 6/2020 | |

* cited by examiner

DISPLAY DEVICE INCLUDING ENCAPSULATION LAYER ON LIGHT EMITTING LAYER

CROSS-REFERENCE TO RELATED APPLICATIONS

This application claims priority from and the benefit of Korean Patent Application No. 10-2020-0167804, filed on Dec. 3, 2020, which is hereby incorporated by reference for all purposes as if fully set forth herein.

BACKGROUND

Field

Embodiments of the invention relate generally to a display device, and more particularly, to a display device that is variously foldable and slidable.

Discussion of the Background

Display devices display various images on display screens to provide information to users. Typically, the display devices display information within an allotted screen.

In recent years, flexible display devices including flexible display modules with flexibility are under development. Unlike flat panel display devices, the flexible display devices are as foldable, rollable, bendable or stretchable as paper. The flexible display devices that are variously modifiable in shape are portable without being limited to existing screen sizes, and are easy to be placed even in curved objects, thereby providing increased user friendliness.

In particular, a display device that is stretchable in a predetermined direction, and includes light emitting elements and lines which are arranged on a stretchable base member, has a limitation of causing a difference in luminance for each color when the base substrate is stretched.

The above information disclosed in this Background section is only for understanding of the background of the inventive concepts, and, therefore, it may contain information that does not constitute prior art.

SUMMARY

The inventive concepts provide a display device including an encapsulation layer enabling color calibration.

The inventive concepts also provide a display device capable of keeping excellent color sense even when stretched by an external force.

Additional features of the inventive concepts will be set forth in the description which follows, and in part will be apparent from the description, or may be learned by practice of the inventive concepts.

An embodiment of the inventive concept provides a display device including a base layer, a light emitting element layer disposed on the base layer, and an encapsulation layer disposed on the light emitting element layer, wherein the encapsulation layer includes an organic film containing a photochromic material that changes color upon stress.

The photochromic material may be represented by Formula 1.

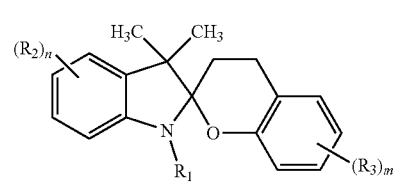

[Formula 1]

In Formula 1 above, $R_1$ is a substituted or unsubstituted alkyl group having 1 to 20 carbon atoms, $R_2$ and $R_3$ are each independently a hydrogen atom, a deuterium atom, a halogen atom, a nitro group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and m and n are each independently an integer of 0 to 4.

In an embodiment, the organic film may further include a base resin.

In an embodiment, the encapsulation layer may further include an inorganic film directly disposed on the light emitting element layer.

In an embodiment, the encapsulation layer may further include at least one inorganic film and at least one organic film which are alternately stacked.

In an embodiment, the encapsulation layer may cover the light emitting element layer.

In an embodiment, the light emitting element layer may include an organic electroluminescence device or a quantum dot light emitting element.

In an embodiment of the inventive concept, a display device includes a base layer including a first pixel area, a second pixel area, and a third pixel area, a light emitting element layer including a first light emitting element, a second light emitting element, and a third light emitting element respectively disposed on the first pixel area, the second pixel area, and the third pixel area, and an encapsulation layer disposed on the light emitting element layer, wherein the encapsulation layer has changes in transmittance when at least one of the first to third pixel areas has a change in aspect ratio.

In an embodiment, the encapsulation layer may have changes in transmittance when at least one of the first to third pixel areas has a change in aspect ratio.

In an embodiment, the encapsulation layer may include at least one inorganic film and at least one organic film which are alternately stacked.

In an embodiment, the organic film may include a base resin and a photochromic material.

In an embodiment, the photochromic material may be represented by Formula 1.

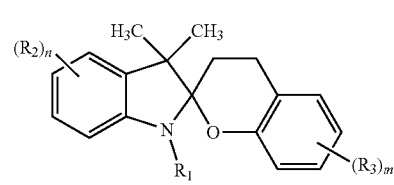

[Formula 1]

In Formula 1 above, $R_1$ is a substituted or unsubstituted alkyl group having 1 to 20 carbon atoms, $R_2$ and $R_3$ are each independently a hydrogen atom, a deuterium atom, a halogen atom, a nitro group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and m and n are each independently an integer of 0 to 4.

In an embodiment, the base resin may contain at least one among polymethyl methacrylate, polymethyl acrylate, polyacrylate, polyurethane, polydimethylsiloxane, polyacrylonitrile, polycaprolactone, polyamide, polysulfone, polyaniline, polystyrene, polybutyl acrylate, epoxy and silicone.

In an embodiment, the encapsulation layer may be disposed to overlap the first pixel area, the second pixel area, and the third pixel area, and may seal the first light emitting element, the second light emitting element, and the third light emitting element.

In an embodiment, the at least one inorganic film may be directly disposed on the light emitting element layer.

In an embodiment, the inorganic film may contain at least one among silicon nitride, silicon oxide, silicon nitrate oxide, titanium oxide, and aluminum oxide.

In an embodiment, the first light emitting element, the second light emitting element, and the third light emitting element each may include a first electrode, functional layers disposed on the first electrode and including an emission layer, and a second electrode disposed on the functional layers.

In an embodiment, the first electrode of the first light emitting element may have a first length, the first electrode of the second light emitting element may have a second length, the first electrode of the third light emitting element may have a third length, wherein the second length may be longer than the first length and the third length.

In an embodiment, the first light emitting element may emit red light, the second light emitting element may emit blue light, and the third light emitting element may emit green light.

In an embodiment, the base layer may include a plurality of unit parts, wherein the plurality of unit parts each include an island portion and a plurality of hinge portions extending from the island portion, and the first pixel area, the second pixel area, and the third pixel area may be disposed in the island portion.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention, and together with the description serve to explain the inventive concepts.

In the drawings.

DETAILED DESCRIPTION

Figure 1A:
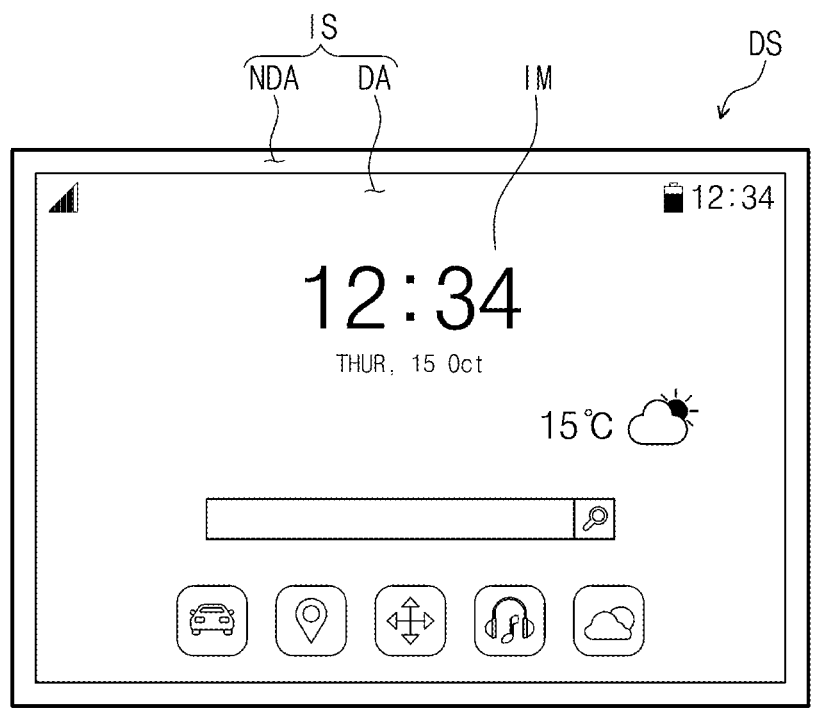
FIGS. 1A and 1B are plan views illustrating a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrating in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1A:
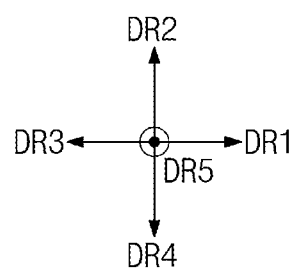
Figure 1B:
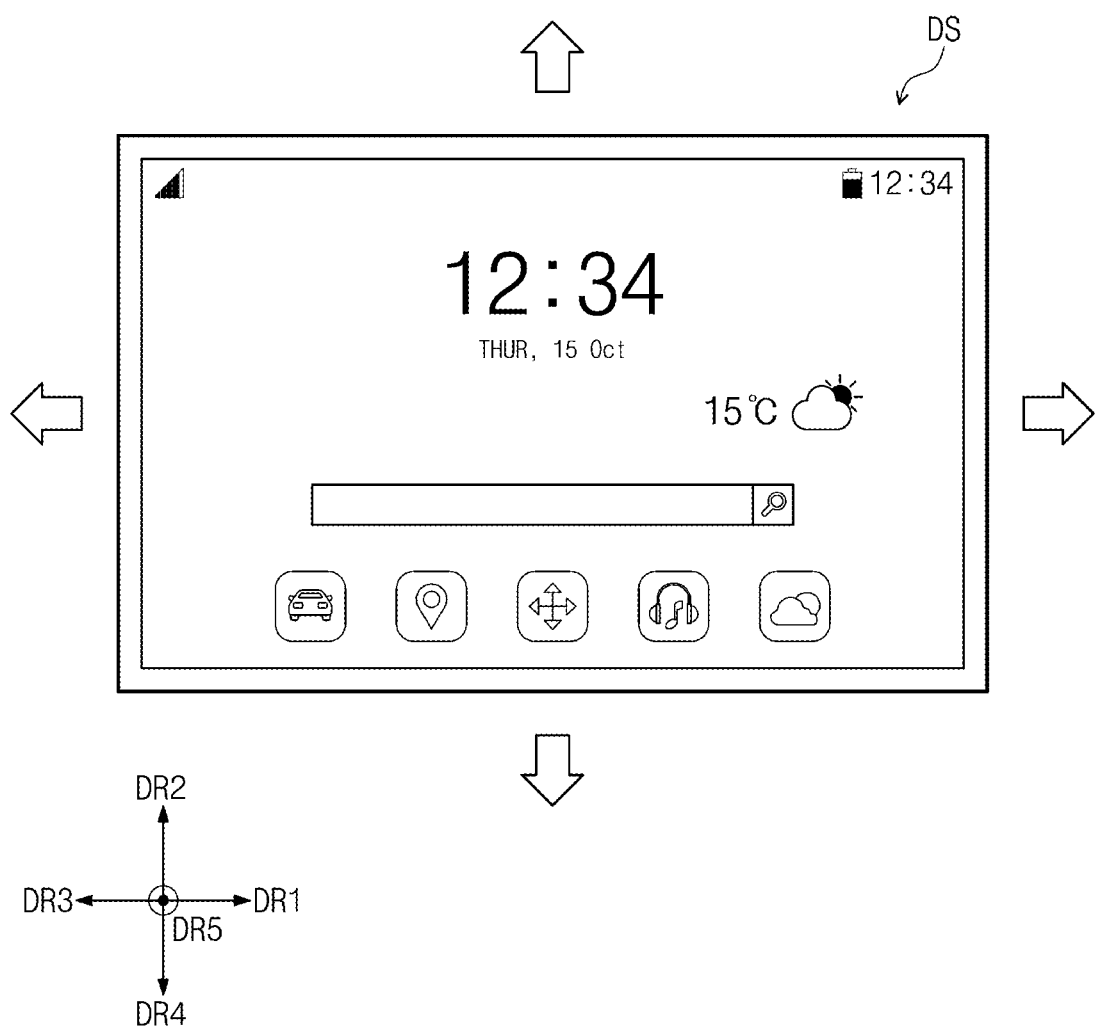

FIGS. 1A and 1B illustrate a display device DS according to an embodiment of the inventive concept. The display device DS illustrated in FIG. 1A is in a state (hereinafter, referred to as a first state) before being stretched. The display device DS illustrated in FIG. 1B is in a state (hereinafter, referred to as a second state) after being stretched in a predetermined direction by an external force.

FIGS. 1A and 1B illustrate a portable electronic device as the display device DS as an example. However, the display device DS may not only be used for large-sized electronic devices such as a television set, a monitor, or an outdoor billboard but also used for small- and medium-sized electronic devices such as a personal computer, a laptop computer, a personal digital terminal, a car navigation unit, a game console, a smartphone, a tablet, and a camera. In addition, these are merely presented as an example, and thus the display device may be adopted for other electronic devices without departing from the inventive concept.

The display surface IS may include a display area DA in which an image IM is displayed, and a non-display area NDA adjacent to the display area DA. The non-display area NDA is an area adjacent to the display area DA, and is an area in which the image IM is not displayed. A bezel area of the display device DS may be defined by the non-display area NDA. In FIG. 1A, a clock window and application icons are presented as an example of the image IM.

The display area DA on which the image IM is displayed may be parallel to a plane defined by a first direction DR1 and a second direction DR2. A third direction DR3 indicates a direction opposite to the first direction DR1, and a fourth direction DR4 indicates a direction opposite to the second direction DR2.

A normal direction of the display area DA, that is, a thickness direction of the display device DS is indicated by a fifth direction DR5. A front surface (or an upper surface) and a rear surface (or a lower surface) of respective members are defined by the fifth direction DR5. However, the directions indicated by the first to fifth directions DR1, DR2, DR3, DR4, and DR5 are relative concepts, and may thus be changed to other directions. Hereinafter, first to fifth directions correspond to the directions indicated by the first to fifth directions DR1, DR2, DR3, DR4, and DR5, respectively, and are given the same reference numerals.

The display area DA may have a rectangular shape. The non-display area NDA may surround the display area DA. However, the embodiment of the inventive concept is not limited thereto, and the shape of the display area DA and the shape of the non-display area NDA may be relatively designed. In addition, the non-display area NDA may not be present on a front surface of the display device DS.

Referring to FIG. 1B, the display device DS according to an embodiment may extend in at least any one of the first to fourth directions DR1, DR2, DR3, and DR4 by an external force. For example, the display device DS according to an embodiment may be a stretchable display device.

Arrows illustrated in FIG. 1B indicate that the display device DS may be stretched in either of the four directions DR1, DR2, DR3, or DR4, but embodiments are not limited thereto. The display device may also be stretched in diagonal directions or other directions that lay between the four directions DR1, DR2, DR3, and DR4. Also, in various embodiments, the display device DS may be stretched in the D5 direction, into or out of the page, in combination with the other directions.

Figure 2:
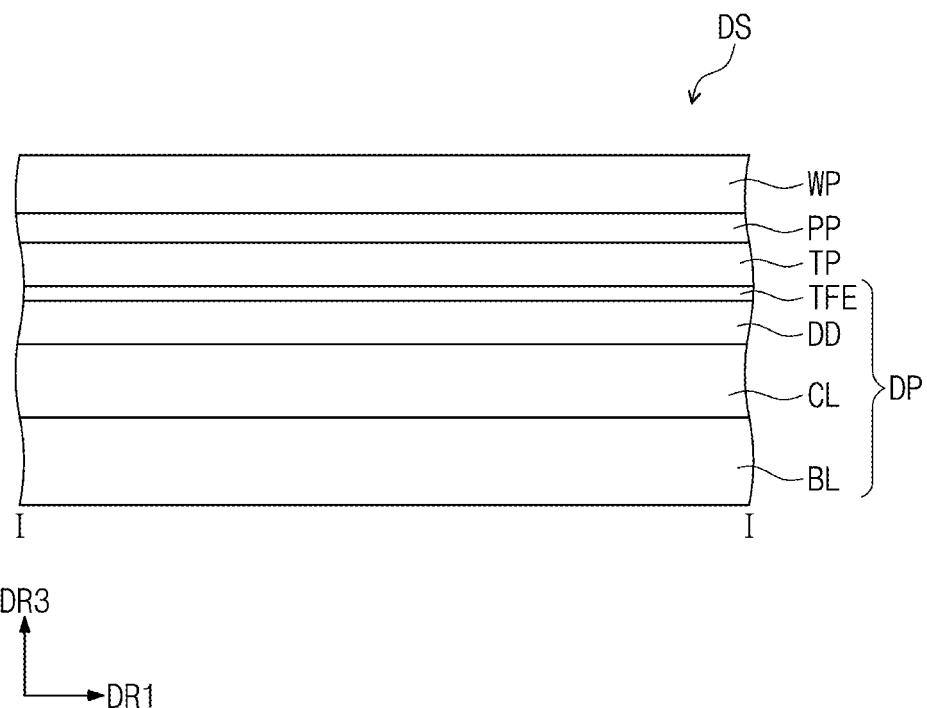
FIG. 2 is a cross-sectional view illustrating a display device according to an embodiment.
Figure 3:
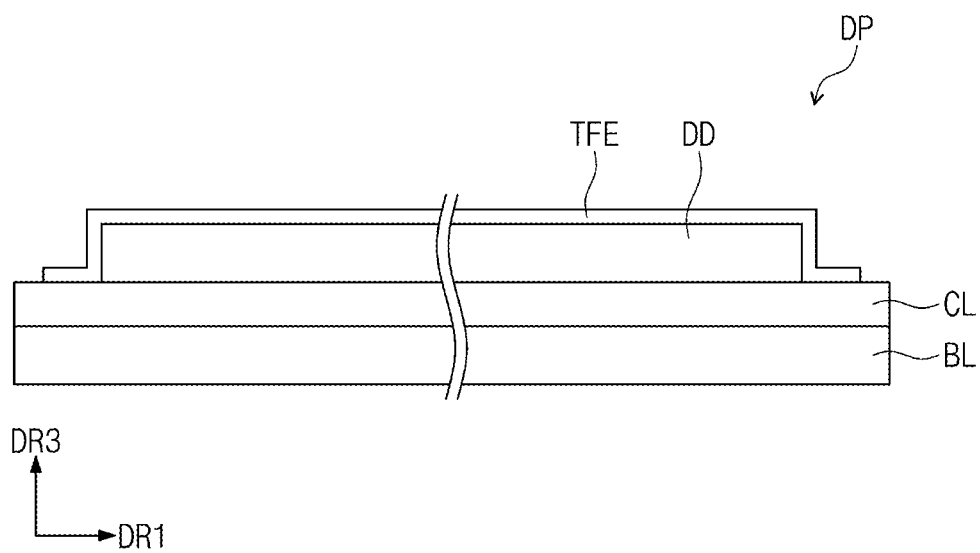
FIG. 3 is a cross-sectional view illustrating a display panel according to an embodiment.
Figure 4A:
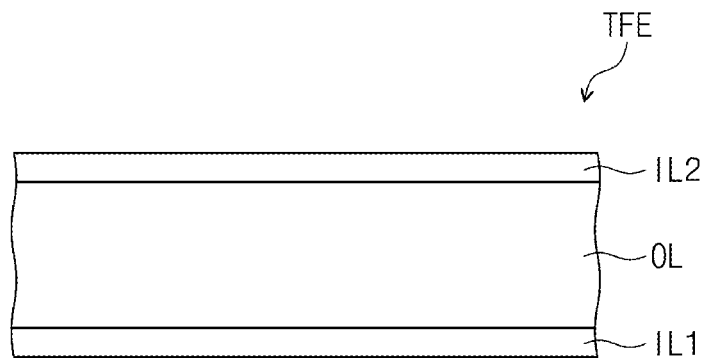
FIGS. 4A and 4B are cross-sectional views illustrating a portion of an encapsulation layer according to an embodiment.
Figure 4B:
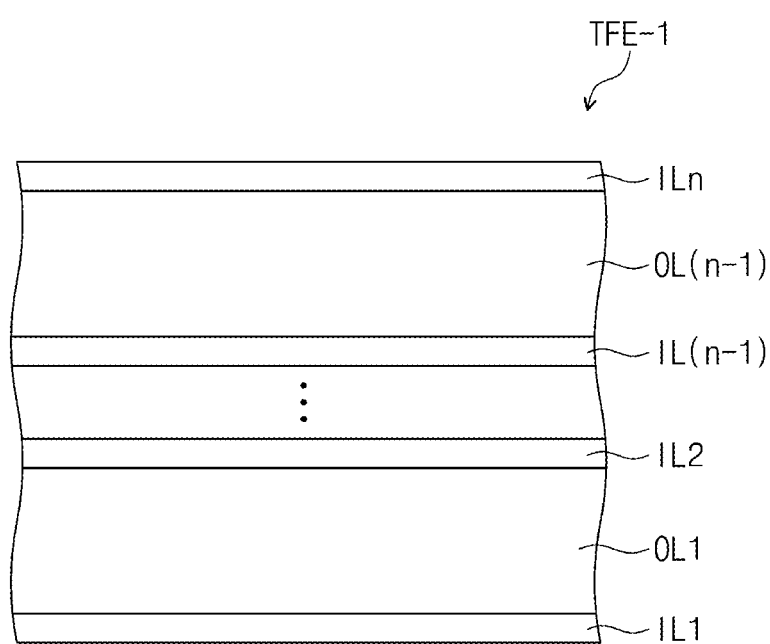

FIG. 2 is a cross-sectional view illustrating a display device DS according to an embodiment and FIG. 3 is a cross-sectional view illustrating a display panel according to an embodiment. FIGS. 4A and 4B are cross-sectional views illustrating a portion of an encapsulation layer TFE according to an embodiment.

The display device DS according to an embodiment may include a display panel DP, an input sensing unit TP disposed on the display panel DP, and an anti-reflection layer PP disposed on the display panel DP. The anti-reflection layer PP may be disposed directly on the input sensing unit TP or be disposed by stacking an organic layer.

The anti-reflection layer PP may control reflected light in the display panel DP due to external light provided to the display panel DP from the outside. The anti-reflection layer PP may include, for example, a polarizing layer or a color filter layer.

The input sensing unit TP may recognize a user's direct touch, a user's indirect touch, a direct touch of an object, or an indirect touch of an object. Meanwhile, the input sensing unit TP may detect at least any one of a location of a touch or strength (pressure) of a touch applied from the outside. The input sensing unit TP in an embodiment of the inventive concept may have various structures or be formed of various materials, and is not limited to any one embodiment. For example, in the display device DS of an embodiment, the input sensing unit TP may be a touch sensing unit detecting a touch.

In addition, the display device DS according to an embodiment may further include a window member WP. The window member WP may define a front surface of the display device DS. The window member WP may be configured to stably protect internal components of the display device DS from external impact. The window member WP may be formed including a glass substrate or a plastic substrate.

The display device DS of FIG. 2 is illustrated to include all of the input sensing unit TP, the polarizing member PP, and the window member WP, but the embodiment is not limited thereto. Unlike the display device DS described above, in the display device DS of an embodiment, the polarizing member PP or the window member WP may be omitted.

In the display device DS of an embodiment, the display panel DP may include a base layer BL, a circuit layer CL provided on the base layer BL, a light emitting element layer DD, and an encapsulation layer TFE disposed on the light emitting element layer DD. Meanwhile, in the display device DS of an embodiment, the base layer BL of the display panel DP may be a member that provides a base surface on which the light emitting element layer DD is disposed. The base layer BL may include a synthetic resin. For example, the base layer BL may include polyimide (PI). However, the embodiment of the inventive concept is not limited thereto, and the base layer BL may be an inorganic layer, an organic layer, or a composite material layer.

In an embodiment, the circuit layer CL may be disposed on the base layer BL, and the circuit layer CL may include a plurality of transistors (not illustrated). The transistors (not illustrated) each may include a control electrode, an input electrode, and an output electrode. For example, the circuit layer CL may include a switching transistor and a driving transistor configured to drive a light emitting element ED.

In an embodiment, the light emitting element layer DD may include a light emitting element ED (FIG. 9) that generates light. The light emitting element ED (FIG. 9) and the light emitting element layer DD will be described in detail later with reference to FIGS. 9 and 10.

The encapsulation layer TFE may cover the light emitting element layer DD. The encapsulation layer TFE may be disposed surrounding the light emitting element layer DD to seal the light emitting element layer DD. The encapsulation layer TFE may protect the light emitting element layer DD from moisture/oxygen, and the encapsulation layer TFE may protect the light emitting element layer DD from foreign substances such as dust particles.

The encapsulation layer TFE may include at least one organic film OL and at least one inorganic film IL1 and IL2. Referring to FIG. 4A, the encapsulation layer TFE may include a first inorganic film IL1 disposed on the light emitting element layer DD, an organic film OL disposed on the first inorganic film IL1, and a second inorganic film IL2 disposed on the organic film OL. The first inorganic film IL1 may be directly disposed on the light emitting element layer DD. However, the structure of the encapsulation layer TFE is not limited thereto, and for example, the encapsulation layer TFE has a structure in which an inorganic film and an organic film are alternately stacked two or more times.

In the display device DS of an embodiment, the encapsulation layer TFE includes a photochromic material. For example, in an embodiment, at least one organic film OL of the encapsulation layer TFE includes a photochromic material. In the present description, the photochromic material refers to a material that is normally transparent in a first state, and changes color in a second state when a force, stress or deformation is applied. Accordingly, when the display device DS of an embodiment is in the first state, the encapsulation layer TFE according to an embodiment of the inventive concept is transparent, and when the display device DS is in the second state due to a force, stress, or deformation, the encapsulation layer TFE is colored and thus have a reduced transmittance. To be specific, the encapsulation layer TFE has a decrease in transmittance by 5% or greater. For example, in the first state, the encapsulation layer TFE may have a visible light transmittance of about 90% or greater, and in the second state, the encapsulation layer TFE may have a visible light transmittance of about 85% or less.

In an embodiment, the photochromic material of the organic film OL may contain a spiropyran compound. The spiropyran compound is transparent, and when a force, stress or deformation is applied, the spiropyran compound changes color.

In an embodiment, the spiropyran compound may be represented by Formula 1.

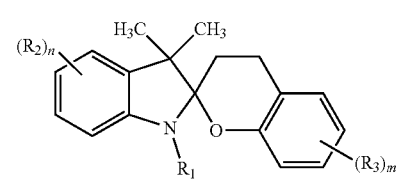

[Formula 1]

In Formula 1, R1 may be a substituted or unsubstituted alkyl group having 1 to 20 carbon atoms, R2 and R3 may be each independently a hydrogen atom, a deuterium atom, a halogen atom, a nitro group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and m and n may be each independently an integer of 0 to 4.

In Formula 1, m and n are each independently an integer of 0 to 4, meanwhile, when m is an integer of 2 or more, a plurality of $R_3$'s are the same as or different from each other, and when n is an integer of 2 or more, a plurality of $R_2$'s are the same as or different from each other.

The spiropyran compound, for example, when receiving a stress event such as force, stress, and deformation applied from the outside in the form of SP having no color as illustrated in Formula 1, changes its molecular structure to the form of MC and may thus be colored in dark purple. However, the changed color of the spiropyran compound may vary depending on types of substituents.

and inorganic films other than the first inorganic film IL1 among the n inorganic films IL1 to ILn may be defined as upper inorganic films.

The encapsulation layer TFE-1 may include n−1 organic films OL1 to OL(n−1), and the n−1 organic films OL1 to OL(n−1) may alternately be disposed with the n inorganic films IL1 to ILn. The n−1 organic films OL1 to OL(n−1) may have a greater thickness than the n inorganic films IL1 to ILn on average.

The n inorganic films IL1 to ILn each may have a single layer including one material or a multilayer including different materials. At least one of the n−1 organic films OL1 to OL(n−1) may be formed from the encapsulation layer composition described above. That is, at least one of the n−1 organic films OL1 to OL(n−1) may include the photochromic material described above.

For example, the n−1 organic films OL1 to OL(n−1) each may be formed by applying the encapsulation composition. To be specific, the organic films OL1 to OLn−1 may be formed using inkjet printing.

Figure 5:
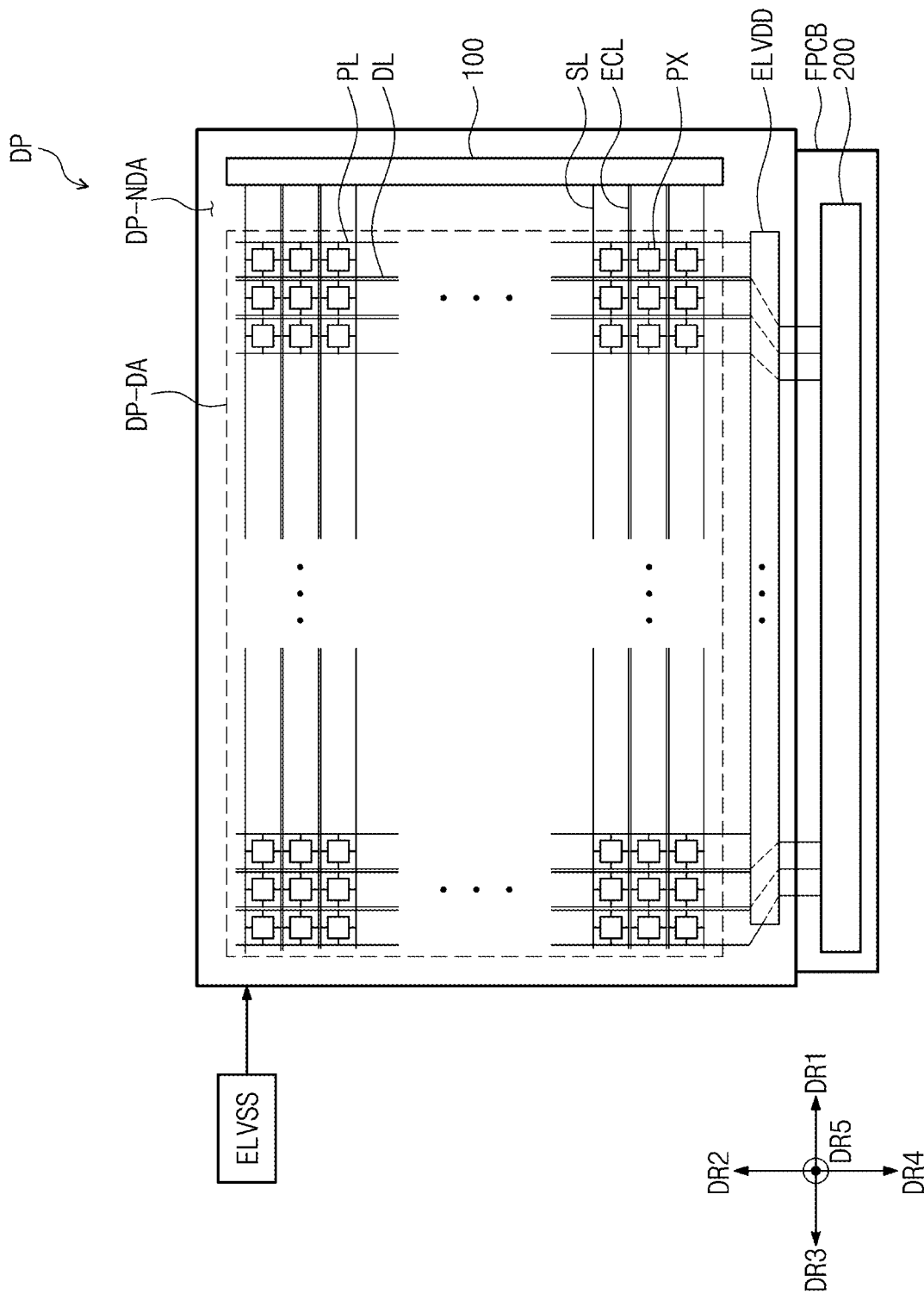
FIG. 5 illustrates a plan view of a display panel according to an embodiment of the inventive concept.

FIG. 5 is a plan view of a display panel DP according to an embodiment of the inventive concept.

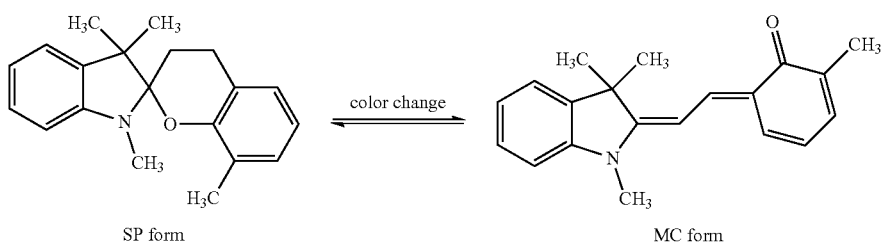

[Chemical Equation 1]

SP form          MC form

The organic film OL may further include a transparent base resin. The transparent base resin may contain at least one selected from polymethyl methacrylate, polymethyl acrylate, polyacrylate, polyurethane, polydimethylsiloxane, polyacrylonitrile, polycaprolactone, polyamide, polysulfone, polyaniline, polystyrene, polybutyl acrylate, epoxy and silicone.

The organic film OL may further include an ultraviolet absorber. For example, the organic film OL may include at least any one among a benzotriazole-based absorber, a benzophenone-based absorber, a salicylic acid-based absorber, and a cyanoacrylate-based ultraviolet absorber. Accordingly, the encapsulation layer TFE may protect the light emitting element layer DD from ultraviolet light.

The inorganic films IL1 and IL2 may contain at least one among silicon nitride (SiNx), silicon oxide (SiOx), silicon nitride oxide (SiOxNy), titanium oxide (TiOx), and aluminum oxide (AlOx). Meanwhile, x and y may be each independently 0 to 4, and x and y are not limited to the integers. The inorganic films IL1 and IL2 may include a silicon nitride layer, a silicon oxy nitride layer, a silicon oxide layer, a titanium oxide layer, an aluminum oxide layer, etc., but is not particularly limited thereto.

Referring to FIG. 4B, an encapsulation layer TFE-1 according to an embodiment may include an inorganic films IL1 to ILn including the first inorganic film IL1 disposed on the light emitting element layer DD (FIG. 3). In addition, the first inorganic film IL1 may be disposed in direct contact with the light emitting element layer DD (FIG. 3). The first inorganic film IL1 may be defined as a lower inorganic film, The display panel DP includes a display area DP-DA and a non-display area DP-NDA on a plane. In the present embodiment, the non-display area DP-NDA may be defined along an edge of the display area DP-DA. The display area DP-DA and the non-display area DP-NDA of the display panel DP may respectively correspond to the display area DA and the non-display area NDA of the display device DS illustrated in FIG. 1A.

The display panel DP may include a scan driver 100, a data driver 200, a plurality of scan lines SL, a plurality of light emitting control lines ECL, a plurality of data lines DL, a plurality of power lines PL, and a plurality of pixels PX (hereinafter referred to as pixels). The pixels PX are disposed in the display area DP-DA. The pixels PX each include a light emitting element ED (see FIG. 6) and a pixel circuit CC (see FIG. 6) connected thereto.

The scan driver 100 may include a scan driver and a light emitting control driver.

The scan driver generates scan signals and sequentially outputs the generated scan signals to the scan lines SL. The light emitting control driver generates light emitting control signals and outputs the generated light emitting control signals to the light emitting control lines ECL.

In another embodiment of the inventive concept, the scan driver and the light emitting control driver are not separated in the scan driver 100 and may be configured as one circuit.

The scan driver 100 may include a plurality of thin film transistors formed through the same process as the driving circuit of the pixels PX, for example, a low temperature polycrystaline silicon (LTPS) process or a low temperature polycrystalline oxide (LTPO) process.

The data driver 200 outputs data signals to the data lines DL. The data signals are analog voltages corresponding to gray-scale values of image data.

In an embodiment of the inventive concept, the data driver 200 may be mounted on a printed circuit board FPCB, and the printed circuit board FPCB may be connected to pads disposed at one end of the data lines DL. However, the embodiment of the inventive concept is not limited thereto, and the data driver 200 may be directly mounted on the display panel DP.

The scan lines SL may extend in the first direction DR1 and may be arranged in the second direction DR2. The scan lines SL may provide scan signals to the pixels PX.

The light emitting control lines ECL may extend in the first direction DR1 and may be arranged in the second direction DR2. That is, each of the light emitting control lines ECL may be arranged parallel to a corresponding scan line among the scan lines SL. The light emitting control lines ECL may provide light emitting control signals to the pixels PX.

The data lines DL may extend in the second direction DR2 and may be arranged in the first direction DR1. The data lines DL may provide data signals to the pixels PX.

The power lines PL may extend in the second direction DR2 and may be arranged in the first direction DR1. The power lines PL may provide a first power ELVDD to the corresponding pixels PX.

Each of the plurality of pixels PX is connected to a corresponding scan line among the scan lines SL, a corresponding light emitting control line among the light emitting control lines ECL, a corresponding data line among the data lines DL, and a corresponding power line among the power lines PL.

A second power ELVSS may be provided to the pixels PX of the display panel DP.

Figure 6:
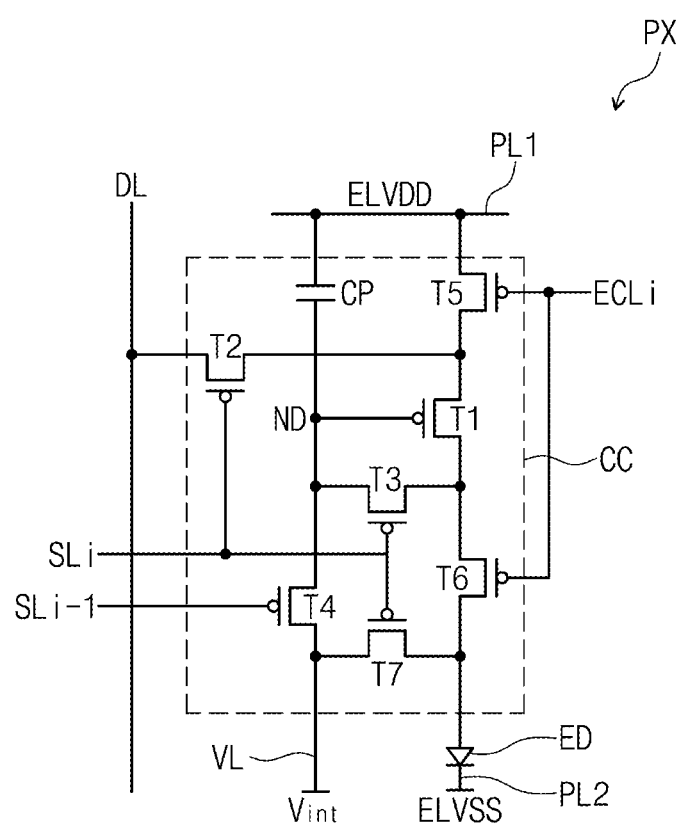
FIG. 6 is an equivalent circuit view corresponding to pixels of FIG. 5.

FIG. 6 illustrates an equivalent circuit view of a pixel PX according to an embodiment of the inventive concept. FIG. 6 illustrates, as an example, a pixel PX connected to an i-th scan line SLi and an i-th light emitting control line ECLi.

The pixel PX may include a light emitting element ED and a pixel circuit CC. The pixel circuit CC may include a plurality of transistors T1 to T7 and a capacitor CP. The pixel circuit CC controls the amount of current flowing through the light emitting element ED in response to data signals.

The light emitting element ED may emit light with a predetermined luminance in response to the amount of current provided from the pixel circuit CC. To this end, the level of the first power ELVDD may be set higher than the level of the second power ELVSS.

The plurality of transistors T1 to T7 each may include an input electrode (or a source electrode), an output electrode (or a drain electrode), and a control electrode (or a gate electrode). In the present description, for convenience of description, any one of the input electrode or the output electrode may be referred to as a first electrode, and the other may be referred to as a second electrode.

The first electrode of the first transistor T1 is connected to the first power ELVDD via the fifth transistor T5, and the second electrode is connected to an anode electrode of the light emitting element ED via the sixth transistor T6. The first transistor T1 may be referred to as a driving transistor in the present description.

The first transistor T1 controls the amount of current flowing through the light emitting element ED in response to voltages applied to the control electrode.

The second transistor T2 is connected between the data line DL and the first electrode of the first transistor T1. In addition, the control electrode of the second transistor T2 is connected to the i-th scan line SLi. The second transistor T2 is turned on when an i-th scan signal Si is provided to the i-th scan line SLi to electrically connect the data line DL with the first electrode of the first transistor T1.

The third transistor T3 is connected between the second electrode of the first transistor T1 and the control electrode. The control electrode of the third transistor T3 is connected to the i-th scan line SLi. The third transistor T3 is turned on when an i-th scan signal Si is provided to the i-th scan line SLi to electrically connect the second electrode of the first transistor T1 with the control electrode. Accordingly, when the third transistor T3 is turned on, the first transistor T1 is connected in the form of a diode.

The fourth transistor T4 is connected between a node ND and an initialization power generation unit (not illustrated). In addition, the control electrode of the fourth transistor T4 is connected to an i–1th scan line SLi–1. The fourth transistor T4 is turned on when an i–1th scan signal Si–1 is provided to the i–1th scan line SLi–1 to provide an initialization voltage Vint to the node ND.

The fifth transistor T5 is connected between the first power line PL1 and the first electrode of the first transistor T1. The control electrode of the fifth transistor T5 is connected to the i-th light emitting control line ECLi.

The sixth transistor T6 is connected between the second electrode of the first transistor T1 and the anode electrode of the light emitting element ED. In addition, the control electrode of the sixth transistor T6 is connected to the i-th light emitting control line ECLi.

The seventh transistor T7 is connected between the initialization power generation unit (not illustrated) and the anode electrode of the light emitting element ED. In addition, the control electrode of the seventh transistor T7 is connected to the i-th scan line SLi. The seventh transistor T7 is turned on when an i-th scan signal Si is provided to the i-th scan line SLi to provide the initialization voltage Vint to the anode electrode of the light emitting element ED.

The seventh transistor T7 may improve black-displaying capability of the pixel PX. To be specific, when the seventh transistor T7 is turned on, a parasitic capacitor (not illustrated) of the light emitting element ED is discharged. Then, when black luminance is implemented, the light emitting element ED does not emit light due to a leakage current from the first transistor T1, and accordingly, the black-displaying capability may be improved.

Additionally, FIG. 6 illustrates that the control electrode of the seventh transistor T7 is connected to the i-th scan line SLi, but the embodiment of the inventive concept is not limited thereto. In another embodiment of the inventive concept, the control electrode of the seventh transistor T7 may be connected to the i–1th scan line SLi–1 or the i+1th scan line SLi+1.

FIG. 6 is illustrated on the basis of PMOS, but the embodiment of the inventive concept is not limited thereto. In another embodiment of the inventive concept, the pixel PX may be formed on the basis of NMOS. In another embodiment of the inventive concept, the pixel PX may be configured through a combination of NMOS and PMOS.

The capacitor CP is disposed between the power line PL1 and the node ND. The capacitor CP stores voltages corresponding to data signals. When the fifth transistor T5 and the sixth transistor T6 are turned on according to the voltages stored in the capacitor CP, the amount of current flowing through the first transistor T1 may be determined.

In an embodiment of the inventive concept, a structure of the pixel PX is not limited to the structure illustrated in FIG.

6. In another embodiment of the inventive concept, the pixel PX may be implemented in various forms to emit light of the light emitting element ED.

In an embodiment of the inventive concept, the light emitting element ED may be an organic light emitting element or a light emitting element using micro LEDs or quantum dots.

Figure 7A:
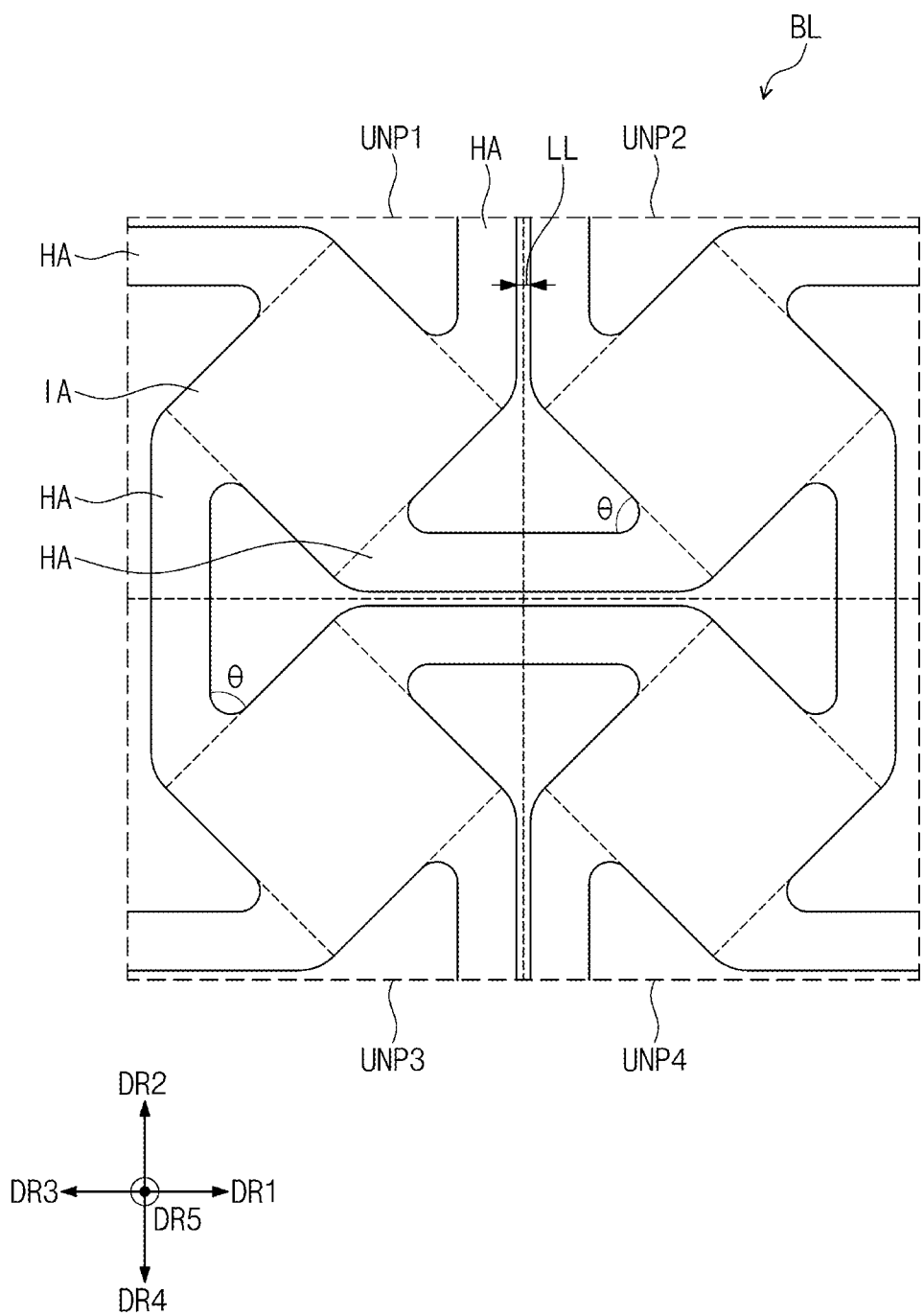
FIGS. 7A and 7B illustrate, as an example, a portion of a base member in which pixels shown in FIG. 6 are disposed.
Figure 7B:
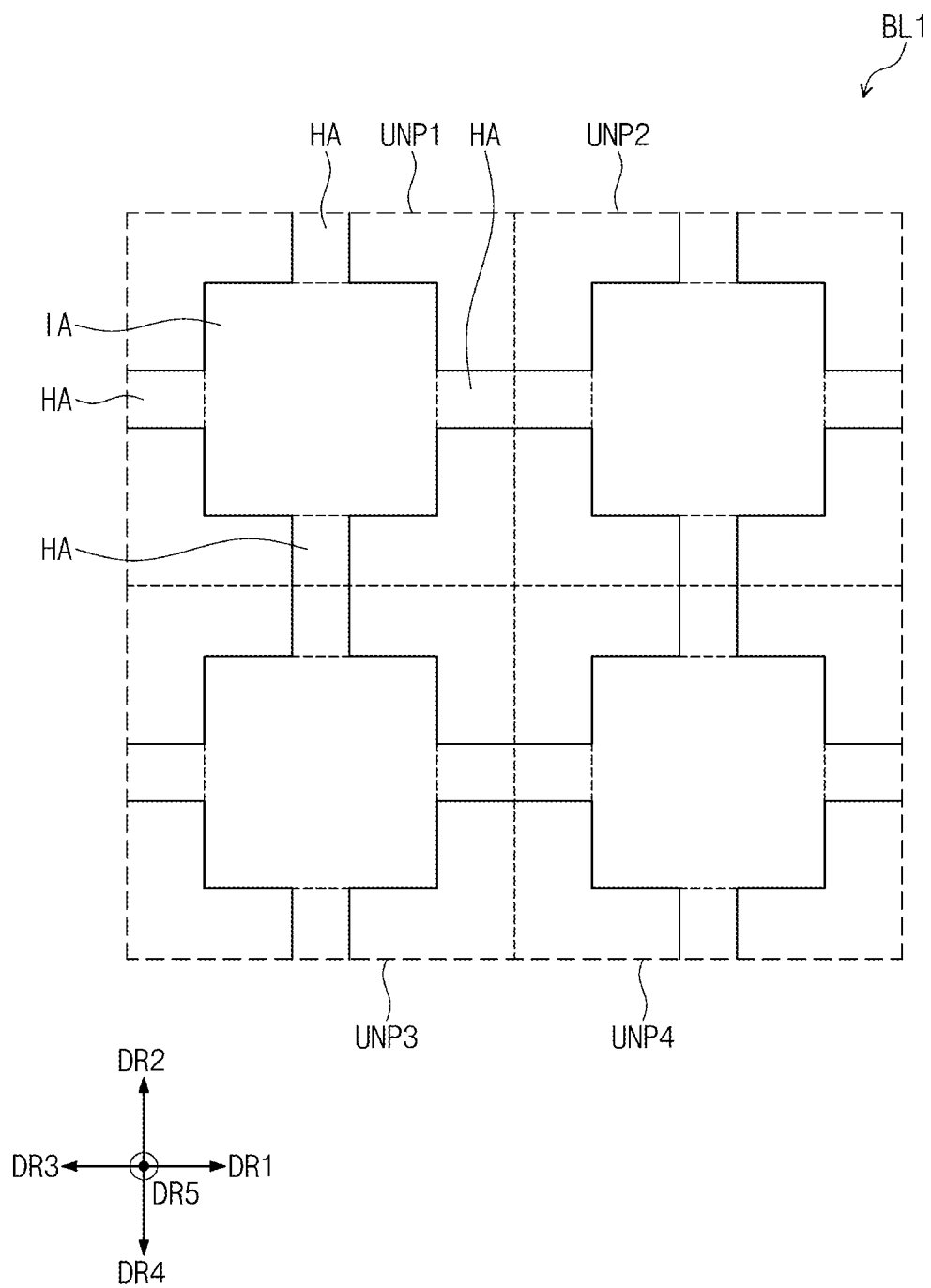

FIGS. 7A and 7B illustrate, as an example, a portion of base layers BL and BL1 on which the pixels PX illustrated in FIG. 6 are disposed. To be specific, FIGS. 7A and 7B illustrate the shapes of the base layers BL and BL1 when the display device DS is in the first state as illustrated in FIG. 1.

Referring to FIG. 7A, in an embodiment, the base layer BL may include a plurality of unit parts UNP1, UNP2, UNP3, and UNP4, such as four unit parts. The four unit parts are illustrated in FIG. 7A as an example, but this illustrates only a portion of the base layer BL, and the base layer BL may include a greater number of unit parts. In the present description, a reference numeral referring to any one of the unit parts UNP1, UNP2, UNP3, and UNP4 may be referred to as UNP.

The unit parts UNP1, UNP2, UNP3, and UNP4 each may include an island portion IA and a plurality of hinge portions HA. FIG. 7A illustrates, as an example, that any one unit part UNP includes one island portion IA and four hinge portions HA, but the number of island portions IA and hinge portions HA may change as necessary.

The island portion IA may be disposed at the center of the unit part UNP. The island portion IA may be disposed in a form rotated 45 degrees from the center of the unit part UNP. The hinge portions HA each may extend from the island portion IA. The hinge portions HA may be spaced apart from each other and may extend in different directions. FIG. 7 illustrates that the hinge portions HA each extend in any one of the first to fourth directions DR1 to DR4, but are not limited thereto. Directions in which the hinge portions HA each extend may change as necessary.

The unit parts UNP1, UNP2, UNP3, and UNP4 may be connected to one another through the hinge portions HA.

When the display device DS changes from the first state to the second state, a separation distance LL between the hinge portion HA of any one unit part UNP and the hinge portion HA of another unit part UNP adjacent to the any one unit part UNP may increase. The increase in separation distance LL occurs when hinge portions HA are disposed parallel to each other across a unit part divider. The separation distances LL may occur at various parallel positions of adjacent hinge portions HA in a directions DR2/DR4 or DR1/DR3. In an embodiment of the inventive concept as illustrated in FIG. 7A, when the display device DS changes from the first state to the second state, an angle θ formed by an edge of the island portion IA and the first direction DR1 may change. The changeable angle θ may also be formed by an edge of the island portion IA and the second direction DR2.

In an embodiment of the inventive concept, when the display device DS changes from the first state to the second state, the angle θ may also represent an angle formed by at least any one of the island portion IA and elongated portions of the hinge portions HA that may change.

Accordingly, when at least any one among the separation distance LL between the hinge portions HA, the angle θ formed by the edge of the island portion IA and the first direction DR1 or second direction DR2, and the angle θ formed by the island portion IA and the hinge portion HA changes, a stretchable display device DS that changes from the first state to the second state may be implemented.

FIG. 7B illustrates a base layer BL1 according to another embodiment. When compared with FIG. 7A, in FIG. 7B, the island portion IA does not rotate when moved from the first state to the second state, and may be disposed parallel and perpendicular to the unit part UNP in all directions.

Figure 8A:
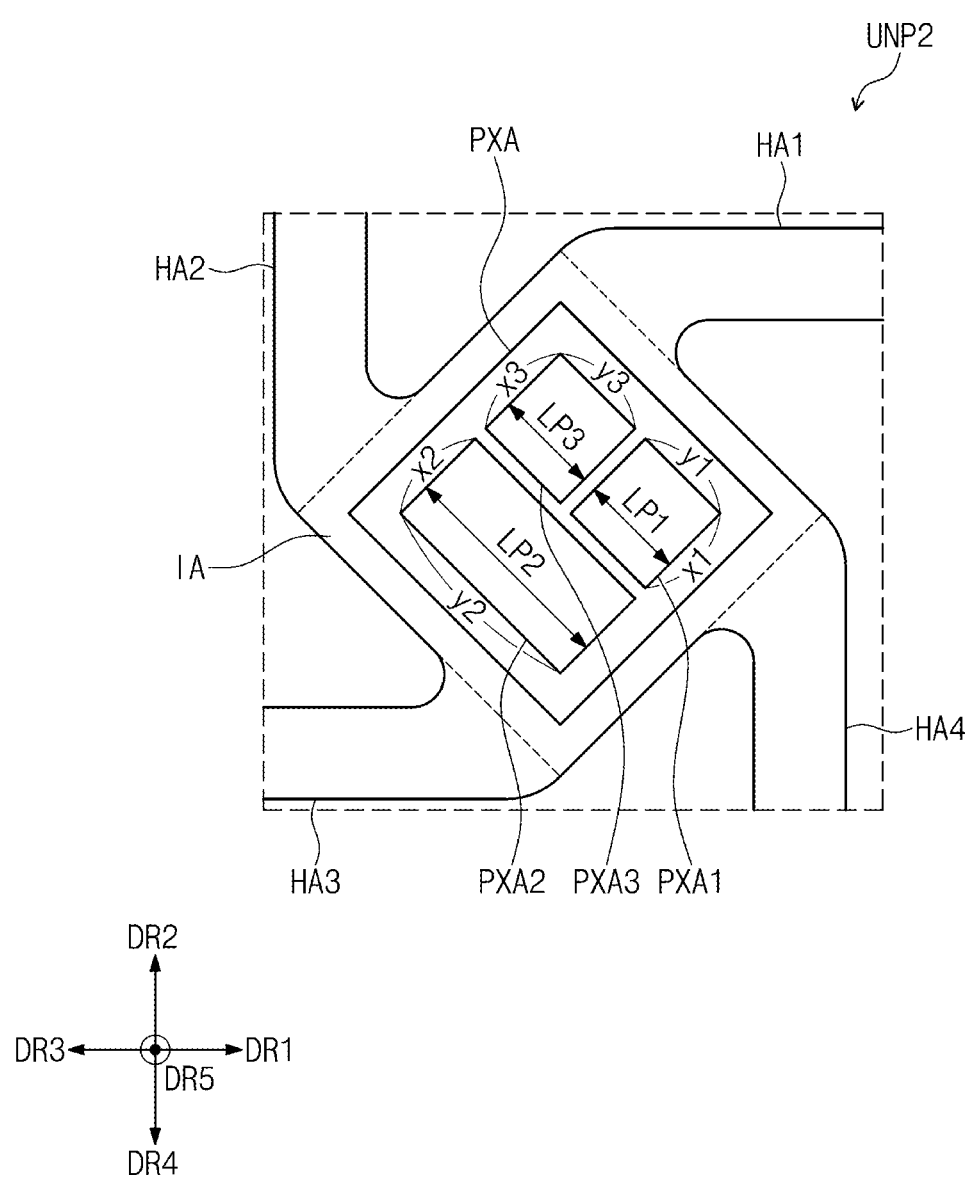
FIGS. 8A and 8B illustrate, as an example, any one unit part according to an embodiment of the inventive concept.
Figure 8B:
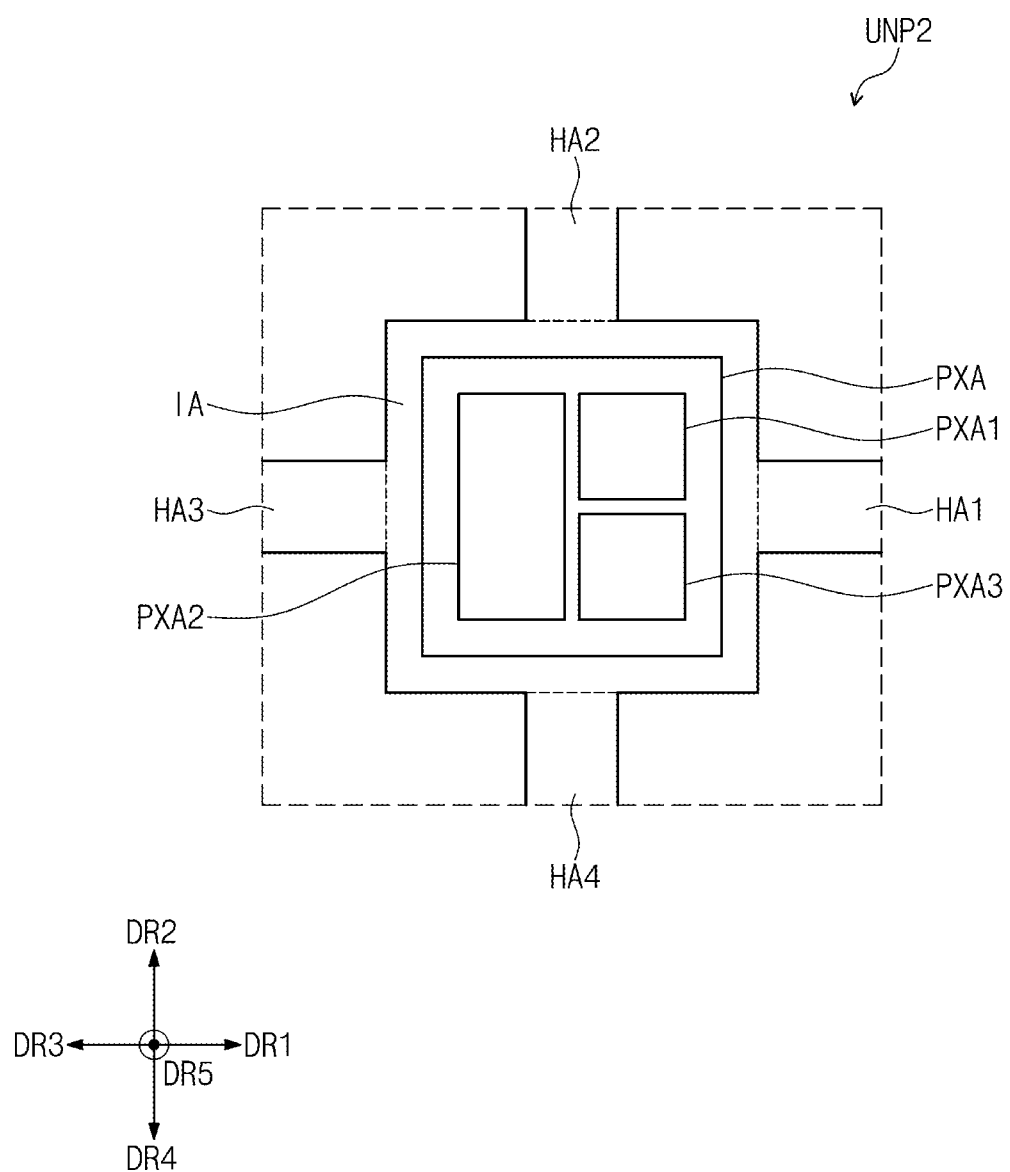

FIGS. 8A and 8B illustrate, as an example, any one unit part UNP2 according to an embodiment of the inventive concept. To be specific, FIG. 8A illustrates, as an example, the second unit part UNP2 among the unit parts UNP1, UNP2, UNP3, and UNP4 illustrated in FIG. 7A, and FIG. 8B illustrate, as an example, the second unit part UNP2 among the unit parts UNP1, UNP2, UNP3, and UNP4 illustrated in FIG. 7B.

The hinge portions HA may include a first hinge portion HA1 extending from the island portion IA in the first direction DR1, and a second hinge portion HA2 extending from the island portion IA in the second direction DR2, a third hinge portion HA3 extending from the island portion IA in the third direction DR3, and a fourth hinge portion HA4 extending from the island portion IA in the fourth direction DR4.

A pixel area PXA may be defined in the island portion IA. The pixel area PXA is an area in which transistors, capacitors, and light emitting elements configured to implement a plurality of pixels PX (see FIG. 6) are disposed.

The pixel area PXA may include a first pixel area PXA1, a second pixel area PXA2, and a third pixel area PXA3. The first pixel area PXA1 and the third pixel area PXA3 may be disposed adjacent to the second pixel area PXA2.

Transistors, capacitors, and light emitting elements configured to emit light having a first color may be disposed in the first pixel area PXA1. In an embodiment of the inventive concept, the first color may be red, but is not limited thereto. In an embodiment, the red light may be light having a wavelength of about 625 nm to about 675 nm.

Transistors, capacitors, and light emitting elements configured to emit light having a second color may be disposed in the second pixel area PXA2. In an embodiment of the inventive concept, the second color may be blue, but is not limited thereto. In an embodiment, the blue light may be light having a wavelength of about 410 nm to about 480 nm.

Transistors, capacitors, and light emitting elements configured to emit light having a third color may be disposed in the third pixel area PXA3. In an embodiment of the inventive concept, the third color may be green, but is not limited thereto. In an embodiment, the green light may be light having a wavelength of about 500 nm to about 570 nm.

A length LP1 of the first pixel area PXA1 measured in one direction (hereinafter the first length), a length LP2 of the second pixel area PXA2 measured in the one direction (hereinafter the second length), and a length LP3 of the third pixel area PXA3 measured in the one direction (hereinafter the third length) each may be determined according to the corresponding first electrode EL1 (see FIG. 9) of the light emitting element ED. That is, when the length of the first electrode EL1 (see FIG. 9) of the light emitting element ED is long, the length of the corresponding pixel area among the first to third pixel areas PXA1, PXA2, and PXA3 is long, and when the length of the first electrode EL1 (see FIG. 9) is short, the length of the corresponding pixel area among the first to third pixel areas PXA1, PXA2, and PXA3 is short.

Referring to FIG. 8A, the second length LP2 may be longer than the first length LP1 and the third length LP3. That is, the length of the first electrode EL1 (see FIG. 9) of the light emitting element ED disposed in the second pixel area PXA2 is longer than the length of the first electrode EL1 (see FIG. 9) of the light emitting element ED disposed in the first pixel area PXA1 or the third pixel area PXA3. That is, as the blue light emitted from the second pixel area PXA2 has lower visibility than the red light emitted from the first pixel area PXA1 and the green light emitted from the third pixel area PXA3, it is to balance out the visibility between colors by increasing an area where the blue light is emitted. However, the embodiment of the inventive concept is not limited thereto, and the first pixel area PXA1, the second pixel area PXA2, and the third pixel area PXA3 may be the same or different from each other in size as desired.

In an embodiment, the first pixel area PXA1 may have a first aspect ratio (x1/y1) which is a ratio of width (x1) and height (y1) of the first pixel area PXA1, and a value of the first aspect ratio (x1/y1) in the first state and a value of the first aspect ratio (x1/y1) in the second state may be different from each other.

In addition, the second pixel area PXA2 may have a second aspect ratio (x2/y2) which is a ratio of width (x2) and height (y2) of the second pixel area PXA2, and a value of the second aspect ratio (x2/y2) in the first state and a value of the second aspect ratio (x2/y2) in the second state may be different from each other.

In an embodiment, the third pixel area PXA3 may have a third aspect ratio (x3/y3) which is a ratio of width (x3) and height (y3) of the third pixel area PXA3, and a value of the third aspect ratio (x3/y3) in the first state and a value of the third aspect ratio (x3/y3) in the second state may be different from each other.

When a force of a certain level or less, for example, an elongation of less than 10%, is applied to the display device DS from the outside, the display device DS may be equally stretched in the first to fourth directions, and the first to third aspect ratios (x1/y1, x2/y2, and x3/y3) may have substantially the same values in the first state and the second state. On the other hand, when a force of a certain level or greater, for example, an elongation of 10% or greater, is applied to the display device DS from the outside, the display device DS may be stretched to different lengths in the first to fourth directions, and in this case, at least one of the first to third aspect ratios (x1/y1, x2/y2, and x3/y3) may have values which are different in the first state and in the second state. In this case, a difference in luminance for each color emitted from each pixel area may be generated.

When at least any one of the first to third aspect ratios (x1/y1, x2/y2, and x3/y3) of the encapsulation layer TFE of an embodiment changes, a complementary color of a color whose luminance is lowered by a photochromic material is expressed to attenuate the generated difference in luminance of the color, and the color may thus be calibrated.

FIG. 8B illustrates any one unit part UNP2 according to another embodiment. When compared with FIG. 8A, in FIG. 8B, the pixel area PXA does not rotate, and may be disposed parallel to the unit part UNP2 in all directions.

Meanwhile, in each of FIGS. 8A and 8B, one pixel area PXA includes the first to third pixel areas PXA1, PXA2, and PXA3 as an example, but the embodiment of the inventive concept is not limited thereto. For example, one pixel area PXA may further include any one or more of the first to third pixel areas PXA1, PXA2, and PXA3.

Figure 9:
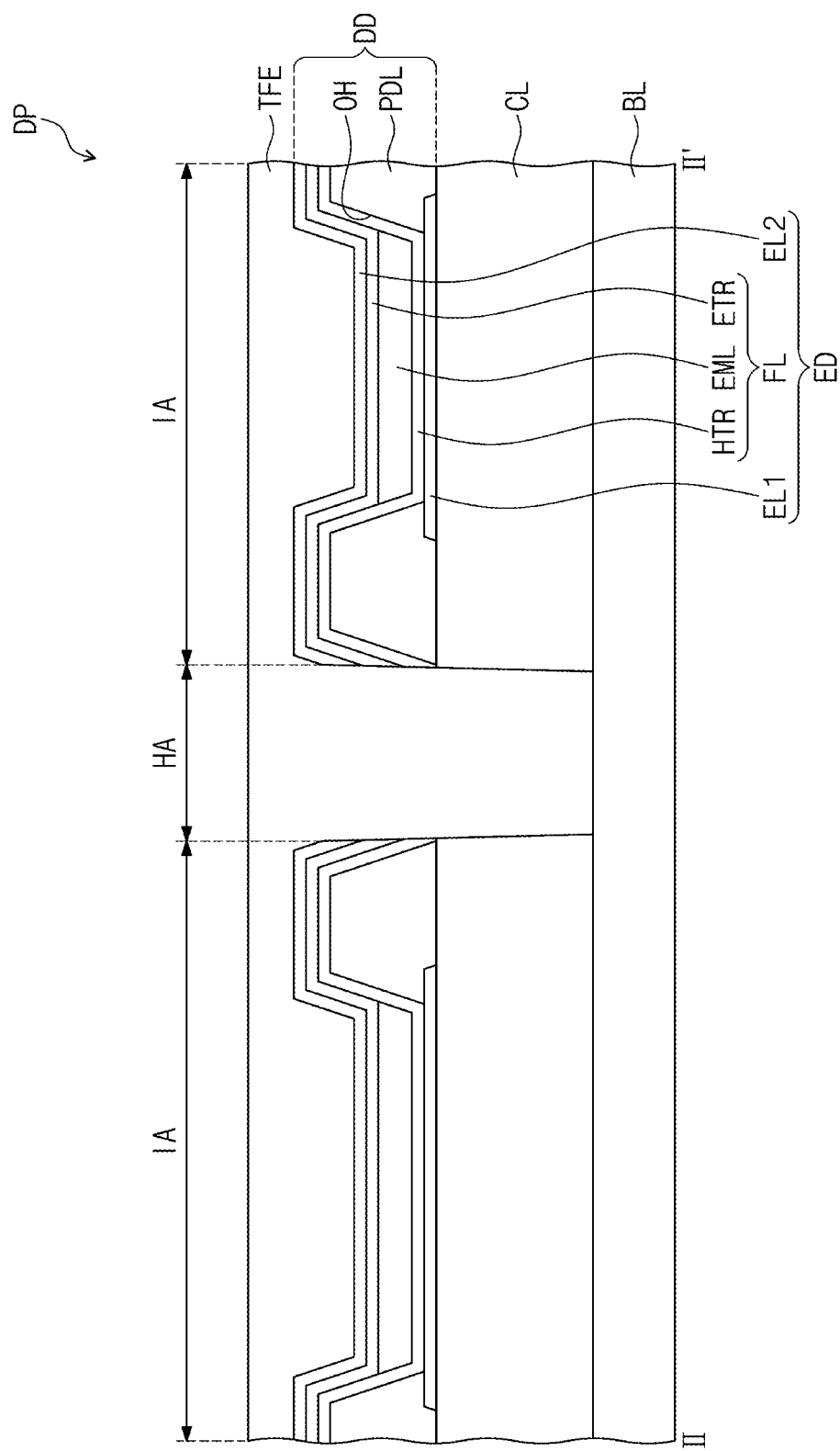
FIG. 9 is a cross-sectional view illustrating a display panel according to an embodiment.
Figure 10:
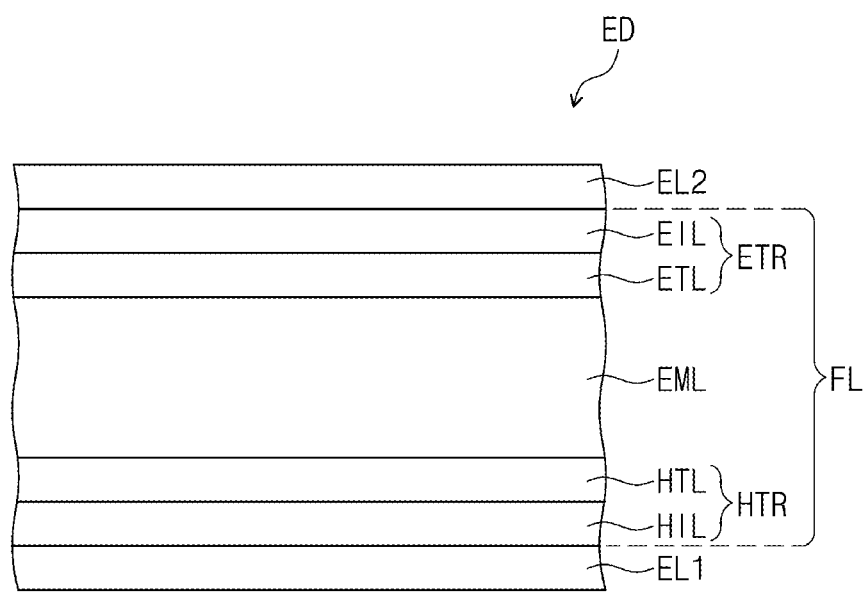
FIG. 10 is a cross-sectional view illustrating a light emitting element according to an embodiment.

FIG. 9 illustrates, as an example, a cross section of a portion of a display panel DP according to an embodiment of the inventive concept. FIG. 9 illustrates, as an example, a cross section corresponding to a portion of an island portion IA and a portion of a hinge portion HA of the display panel DP. FIG. 10 is a cross-sectional view illustrating a light emitting element ED according to an embodiment.

The display panel DP may include a base layer BL, a circuit layer CL, a light emitting element layer DD, and an encapsulation layer TFE.

The display panel DP according to an embodiment may be a light emitting type. For example, the display panel DP may be an organic electroluminescence display panel, a display panel including an inorganic LED, or a quantum dot light emitting display panel. However, the embodiment of the inventive concept is not limited thereto.

When the display panel DP is an organic electroluminescence display panel, the light emitting element layer DD may include an organic electroluminescence device. In addition, when the display panel DP is a quantum dot light emitting display panel, the light emitting element layer DD may include a quantum dot emission layer.

The light emitting element layer DD may include a pixel defining film PDL and a light emitting element ED.

The pixel defining film PDL may be formed of a polymer resin. For example, the pixel defining film PDL may be formed including a polyacrylate-based resin or a polyimide-based resin. In addition, the pixel defining film PDL may be formed by further including an inorganic material in addition to the polymer resin. Meanwhile, the pixel defining film PDL may be formed including a light absorbing material, or may be formed including a black pigment or a black dye. The pixel defining film PDL formed including a black pigment or a black dye may implement a black pixel defining film. When forming the pixel defining film PDL, carbon black may be used as a black pigment or a black dye, but the embodiment of the inventive concept is not limited thereto.

In addition, the pixel defining film PDL may be formed of an inorganic material. For example, the pixel defining film PDL may be formed including silicon nitride (SiNx), silicon oxide (SiOx), silicon oxynitride (SiOxNy), etc.

In an embodiment, the light emitting element ED is disposed to overlap the island portion IA, and adjacent light emitting elements ED may be disposed to be separated from each other at the hinge portion HA.

In an embodiment, the light emitting element ED may include a first electrode EL1 and a second electrode EL2 facing each other, and a plurality of functional layers FL disposed between the first electrode EL1 and the second electrode EL2. The functional layers FL may include a hole transport region HTR, an emission layer EML, and an electron transport region ETR.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The hole transport region HTR may include a hole injection layer HIL and a hole transport layer HTL, and the electron transport region ETR may include an electron injection layer EIL and an electron transport layer ETL. In addition, unlike the one above, the hole transport region HTR may only include any one of a hole injection layer HIL or a hole transport layer HTL, and the electron transport region ETR may only include any one of an electron injection layer EIL or an electron transport layer ETL. A known hole transport material and a known electron transport material may be used for the hole transport region HTR and the electron transport region ETR, respectively.

Meanwhile, the hole transport region HTR may be disposed on the first electrode EL1 in an opening OH defined in the pixel defining film PDL and disposed extending above the pixel defining film PDL. However, the embodiment of the inventive concept is not limited thereto, and the hole transport region HTR may be patterned to be disposed inside the opening OH.

The emission layer EML is provided on the hole transport region HTR. The emission layer EML may have a single layer formed of a single material, a single layer formed of a plurality of different materials, or a multilayer structure having a plurality of layers formed of a plurality of different materials.

The emission layer EML is not particularly limited as long as it is a commonly used material, but may be formed of a material emitting red, green, and blue, and may include a fluorescent material or a phosphorescent material. In addition, the emission layer EML may include a host and a dopant. For example, the emission layer EML may be disposed in the opening OH defined in the pixel definition film PDL, but the embodiment is not limited thereto. When the display panel DP is an organic electroluminescence display panel, the emission layer EML may include a host and a dopant as an organic electroluminescence material.

When the display panel DP according to an embodiment is a quantum dot light emitting display panel, the display panel DP may include a quantum dot material in the emission layer EML. The core of a quantum may be selected from a Group II-VI compound, a Group I-III-VI compound, a Group III-V compound, a Group IV-VI compound, a Group IV element, a Group IV compound, and a combination thereof.

The encapsulation layer TFE may be disposed on the light emitting element ED, and the encapsulation layer TFE may be disposed on the second electrode EL2. The encapsulation layer TFE may be directly disposed on the second electrode EL2. For the encapsulation layer TFE, the description of the encapsulation layer TFE according to the above-described embodiment may be equally applied.

The display device of an embodiment includes a base layer, a light emitting element layer disposed on the base layer, and an encapsulation layer disposed on the light emitting element layer and containing an organic film. The organic film of an embodiment includes a photochromic material and may thus be colored when a certain force is applied to the display device. Accordingly, changes in luminance for each color, which is caused when a certain force is applied to the display device from the outside are reduced, and a display device having excellent color sense even when an external force is applied may thus be provided.

A display device according to an embodiment includes an encapsulation layer having a variable transmittance, and may thus reduce a difference in luminance for each color that may be caused when the display device is stretched.

Accordingly, the technical scope of the inventive concept is not intended to be limited to the contents set forth in the detailed description of the specification, but is intended to be defined by the appended claims.

Although certain embodiments and implementations have been described herein, other embodiment and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a base layer, the base layer including a first pixel area having a first length, a second pixel area having a second length, and a third pixel area having a third length, the second length being longer than the first length and the third length;
   a light emitting element layer on the base layer; and
   an encapsulation layer on the light emitting element layer, wherein
   the encapsulation layer includes an organic film containing a photochromic material that is configured to change color upon a stress event and a base resin, and
   the base resin contains at least one among polymethyl methacrylate, polymethyl acrylate, polyacrylate, polyurethane, polydimethylsiloxane, polyacrylonitrile, polycaprolactone, polyamide, polysulfone, polyaniline, polystyrene, polybutyl acrylate, epoxy and silicone.

2. The display device of claim 1, wherein the photochromic material is represented by Formula 1:

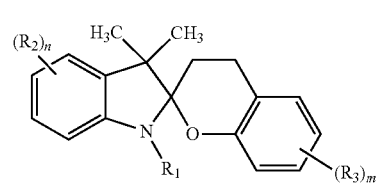

[Formula 1]

wherein in Formula 1,
$R_1$ is a substituted or unsubstituted alkyl group having 1 to 20 carbon atoms,
$R_2$ and $R_3$ are each independently a hydrogen atom, a deuterium atom, a halogen atom, a nitro group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
m and n are each independently an integer of 0 to 4.

3. The display device of claim 1, wherein the encapsulation layer further comprises:
   an inorganic film directly disposed on the light emitting element layer.

4. The display device of claim 3, wherein the encapsulation layer further comprises:
   at least one inorganic film and at least one organic film which are alternately stacked.

5. The display device of claim 1, wherein the encapsulation layer covers the light emitting element layer.

6. The display device of claim 1, wherein the light emitting element layer comprises:
   an organic electroluminescence device or a quantum dot light emitting element.

7. The display device of claim 1, wherein the encapsulation layer has a variable transmittance so as to reduce a difference in luminance caused when the display device is stretched.

8. A display device comprising:
   a base layer including a first pixel area, a second pixel area, and a third pixel area;
   a light emitting element layer including a first light emitting element, a second light emitting element, and a third light emitting element respectively disposed on the first pixel area, the second pixel area, and the third pixel area; and
   an encapsulation layer disposed on the light emitting element layer, wherein the encapsulation layer has changes in transmittance when at least one of the first to third pixel areas has a change in value of an aspect ratio from a first state to a second state, wherein the encapsulation layer contains a base resin and a photochromic material that is configured to change color upon a stress event, and the base resin contains at least one among polymethyl methacrylate, polymethyl acrylate, polyacrylate, polyurethane, polydimethylsiloxane, polyacrylonitrile, polycaprolactone, polyamide, polysulfone, polyaniline, polystyrene, polybutyl acrylate, epoxy and silicone.

9. The display device of claim 8, wherein the encapsulation layer has a decrease in transmittance by 5% or greater when at least one of the first to third pixel areas has a change in value of the aspect ratio from the first state to the second state.

10. The display device of claim 8, wherein the encapsulation layer comprises:
at least one inorganic film and at least one organic film which are alternately stacked.

11. The display device of claim 10, wherein the at least one organic film comprises:
the base resin and the photochromic material.

12. The display device of claim 11, wherein the photochromic material is represented by Formula 1:

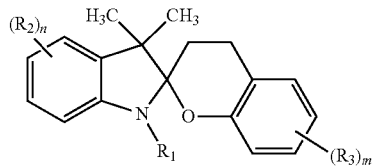

[Formula 1]

wherein in Formula 1,
R₁ is a substituted or unsubstituted alkyl group having 1 to 20 carbon atoms,
R₂ and R₃ are each independently a hydrogen atom, a deuterium atom, a halogen atom, a nitro group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
m and n are each independently an integer of 0 to 4.

13. The display device of claim 10, wherein the at least one inorganic film is directly disposed on the light emitting element layer.

14. The display device of claim 10, wherein the inorganic film contains at least one among silicon nitride, silicon oxide, silicon nitrate oxide, titanium oxide, and aluminum oxide.

15. The display device of claim 8, wherein the encapsulation layer is disposed to overlap the first pixel area, the second pixel area, and the third pixel area, and seals the first light emitting element, the second light emitting element, and the third light emitting element.

16. The display device of claim 8, wherein the first light emitting element, the second light emitting element, and the third light emitting element each comprise:
a first electrode;
functional layers on the first electrode and including an emission layer; and
a second electrode on the functional layers.

17. The display device of claim 16, wherein:
the first electrode of the first light emitting element has a first length;
the first electrode of the second light emitting element has a second length; and
the first electrode of the third light emitting element has a third length,
the second length being longer than the first length and the third length.

18. The display device of claim 16, wherein:
the first light emitting element emits red light;
the second light emitting element emits blue light; and
the third light emitting element emits green light.

19. The display device of claim 8, wherein:
the base layer includes a plurality of unit parts, the plurality of unit parts each including an island portion and a plurality of hinge portions extending from the island portion; and
the first pixel area, the second pixel area, and the third pixel area are disposed in the island portion.

20. An electronic device comprising a display device, wherein the display device comprises:
a base layer, the base layer including a first pixel area having a first length, a second pixel area having a second length, and a third pixel area having a third length, the second length being longer than the first length and the third length;
a light emitting element layer on the base layer; and
an encapsulation layer on the light emitting element layer, wherein the encapsulation layer includes an organic film containing a photochromic material that is configured to change color upon a stress event and a base resin, and
the base resin contains at least one among polymethyl methacrylate, polymethyl acrylate, polyacrylate, polyurethane, polydimethylsiloxane, polyacrylonitrile, polycaprolactone, polyamide, polysulfone, polyaniline, polystyrene, polybutyl acrylate, epoxy and silicone.

* * * * *